(12) United States Patent
Tsuchiya et al.

(10) Patent No.: US 10,388,839 B2
(45) Date of Patent: Aug. 20, 2019

(54) LIGHT-EMITTING DEVICE

(71) Applicant: TOYODA GOSEI CO., LTD., Kiyosu-shi (JP)

(72) Inventors: Yosuke Tsuchiya, Kiyosu (JP); Makoto Ishida, Kiyosu (JP); Motoyuki Tanaka, Kiyosu (JP); Akiko Kimura, Kiyosu (JP); Toshiaki Mori, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/334,831

(22) Filed: Oct. 26, 2016

(65) Prior Publication Data
US 2017/0117447 A1 Apr. 27, 2017

(30) Foreign Application Priority Data
Oct. 27, 2015 (JP) ................................ 2015-210710

(51) Int. Cl.
*H01L 33/00* (2010.01)
*H01L 33/62* (2010.01)
(Continued)

(52) U.S. Cl.
CPC .............. *H01L 33/62* (2013.01); *H01L 33/38* (2013.01); *H01L 33/486* (2013.01)

(58) Field of Classification Search
CPC .... H05K 2201/10106; H01L 23/49805; H01L 33/483–33/486; H01L 33/62;
(Continued)

(56) References Cited

U.S. PATENT DOCUMENTS 7,812,364 B2 * 10/2010 Seko ....................... H01L 33/62
257/666
8,120,043 B2    2/2012 Namioka
(Continued)

FOREIGN PATENT DOCUMENTS

JP    H10-223817 A    8/1998
JP    2010-010437 A    1/2010
(Continued)

OTHER PUBLICATIONS

Japanese Office Action dated Jul. 10, 2018 in counterpart Japanese Application No. 2015-210710 with an English translation thereof.

*Primary Examiner* — Daniel Whalen
(74) *Attorney, Agent, or Firm* — McGinn I.P. Law Group, PLLC.

(57) ABSTRACT

A side view type surface mounted light-emitting device includes a submount substrate that includes a mounting surface on one side surface and end through-holes formed at both edges of the mounting surface, a light-emitting element mounted on the submount substrate, first and second flat terminals formed on the mounting surface, and first and second through-hole terminals respectively formed on inner surfaces of the end through-holes at both edges of the mounting surface. At least one of the first flat terminal and the first through-hole terminal is electrically connected to one of n-side and p-side electrodes of the light-emitting element, and at least one of the second flat terminal and the second through-hole terminal is electrically connected to the other of the n-side and p-side electrodes of the light-emitting element.

20 Claims, 4 Drawing Sheets

(51) Int. Cl.
*H01L 33/48* (2010.01)
*H01L 33/38* (2010.01)

(58) Field of Classification Search
CPC ......... H01L 33/48; H01L 33/38; H01L 33/52; H01L 33/54; H01L 2933/0066; H01L 2933/005; H01L 2933/0033; H01L 27/15–27/156
USPC .............................................. 257/99; 438/26
See application file for complete search history.

(56) References Cited

U.S. PATENT DOCUMENTS

| | | | | | |
|---|---|---|---|---|---|
| 8,288,791 | B2* | 10/2012 | Bogner | ............. | H01L 23/49805 257/680 |
| 8,816,369 | B2* | 8/2014 | Yan | ....................... | H01L 33/486 257/100 |
| 2005/0093146 | A1* | 5/2005 | Sakano | ................... | H01L 33/62 257/730 |
| 2009/0321750 | A1 | 12/2009 | Namioka | | |
| 2010/0176507 | A1* | 7/2010 | Shiv | ........................ | B81B 7/007 257/698 |
| 2011/0242450 | A1* | 10/2011 | Kashimura | .......... | H05K 3/3442 349/61 |
| 2012/0286301 | A1* | 11/2012 | Kobayakawa | ........ | H01L 29/866 257/88 |
| 2013/0037847 | A1* | 2/2013 | Sugiura | ................. | H01L 33/642 257/99 |
| 2015/0340569 | A1* | 11/2015 | Tamaki | ................... | H01L 33/56 257/98 |
| 2017/0324012 | A1* | 11/2017 | Wittmann | .............. | H01L 33/62 |

FOREIGN PATENT DOCUMENTS

| | | |
|---|---|---|
| JP | 2010-199253 A | 9/2010 |
| JP | 2012-212794 A | 11/2012 |

* cited by examiner

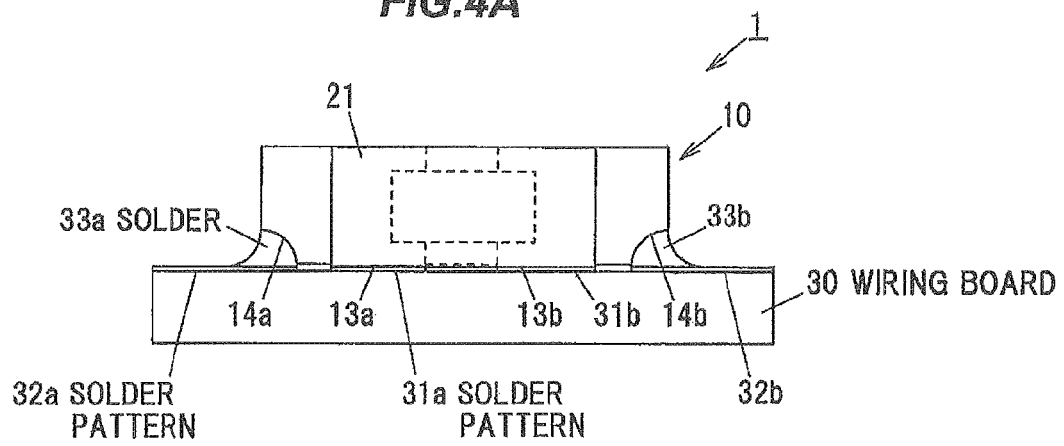
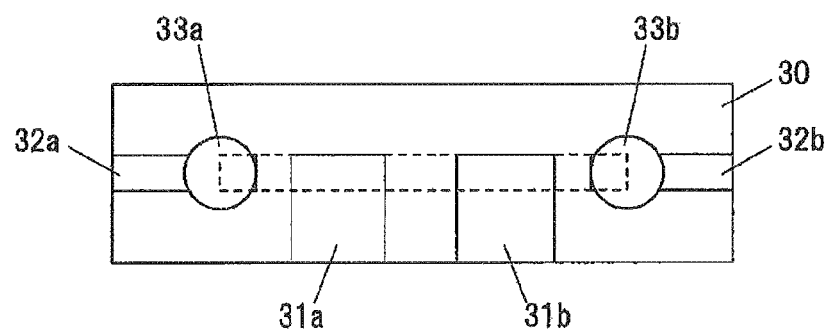

LIGHT-EMITTING DEVICE

The present application is based on Japanese patent application No. 2015-210710 filed on Oct. 27, 2015, the entire contents of which are incorporated herein by reference.

BACKGROUND OF THE INVENTION

1. Field of the Invention

The invention relates to a light-emitting device.

2. Description of the Related Art

An optical semiconductor device using a surface mount ceramic package is known which has electrode terminal solder pads and dummy solder pads on a mounting surface of the ceramic package (see e.g., JP-A-2010-10437).

Since the optical semiconductor device of JP-A-2010-10437 has the dummy solder pads, it is possible to ensure positional stability during the reflow soldering process and thermal fatigue life of the soldered portion of the electrode terminal solder pads also can be improved.

Also, a surface mounted optical semiconductor device is known which has a level difference on a back surface of the package on which a lead is exposed (see e.g., JP-A-2010-199253).

In the optical semiconductor device of JP-A-2010-199253, solder creeps up along a recessed portion of the level difference of the lead and forms solder fillets during the reflow soldering process at the time of side-view mounting the optical semiconductor device. In this case, solder fillets are formed in one direction unlike when solder creeps up along a raised portion of the lead. Therefore, it is possible to stabilize the position of the terminals with respect to the mounting substrate while preventing the faulty mounting.

SUMMARY OF THE INVENTION

It is an object of the invention to provide a side view type surface mounted light-emitting device that prevents a displacement when being mounted on a wiring board by reflow soldering.

(1) According to an embodiment of the invention, a side view type surface mounted light-emitting device, comprising:

a submount substrate that comprises a mounting surface on one side surface and end through-holes formed at both edges of the mounting surface;

a light-emitting element mounted on the submount substrate;

first and second flat terminals formed on the mounting surface; and first and second through-hole terminals respectively formed on inner surfaces of the end through-holes at both edges of the mounting surface, wherein at least one of the first flat terminal and the first through-hole terminal is electrically connected to one of n-side and p-side electrodes of the light-emitting element, and at least one of the second flat terminal and the second through-hole terminal is electrically connected to the other of the n-side and p-side electrodes of the light-emitting element.

In the above embodiment (1) of the invention, the following modifications and changes can be made.

(i) Both the first flat terminal and the first through-hole terminal are electrically connected to one of the n-side and p-side electrodes of the light-emitting element, and wherein both the second flat terminal and the second through-hole terminal are electrically connected to the other of the n-side and p-side electrodes of the light-emitting element.

(ii) Either the first flat terminal or the first through-hole terminal and either the second flat terminal or the second through-hole terminal are terminals to be connected to non-connect electrodes or ground electrodes.

(iii) A surface of the submount substrate opposite to the surface mounting the light-emitting element is continuously plated from the first through-hole terminal to the second through-hole terminal.

Effects of the Invention

According to an embodiment of the invention, a side view type surface mounted light-emitting device can be provided that prevents a displacement when being mounted on a wiring board by reflow soldering.

BRIEF DESCRIPTION OF THE DRAWINGS

Next, the present invention will be explained in more detail in conjunction with appended drawings, wherein:

FIGS. 4A and 4B are side and top views showing a process of mounting the light-emitting device in the embodiment by reflow soldering.

DETAILED DESCRIPTION OF THE PREFERRED EMBODIMENTS

Embodiment

Configuration of Light-Emitting Device

Figure 1A:
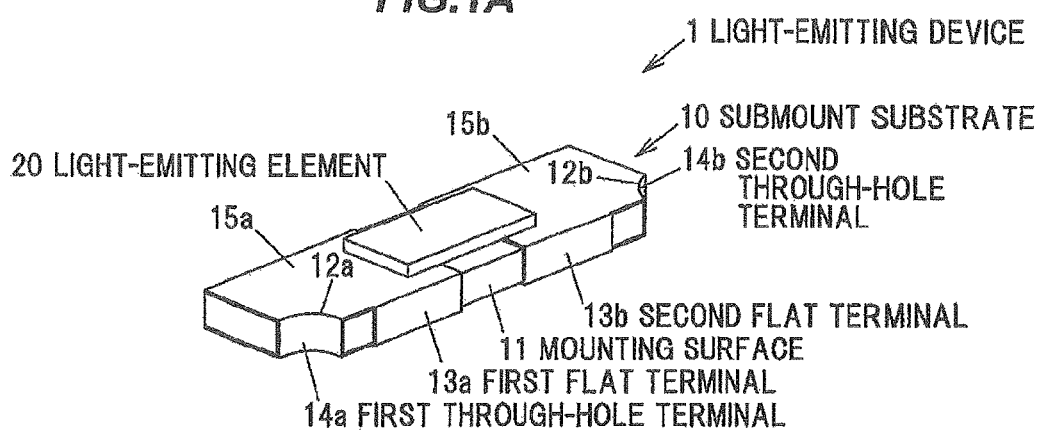
FIGS. 1A and 1B are perspective views showing a light-emitting device in an embodiment.
Figure 1B:
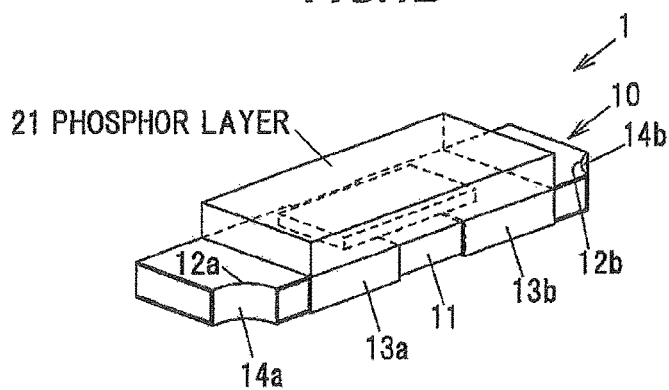
Figure 2A:
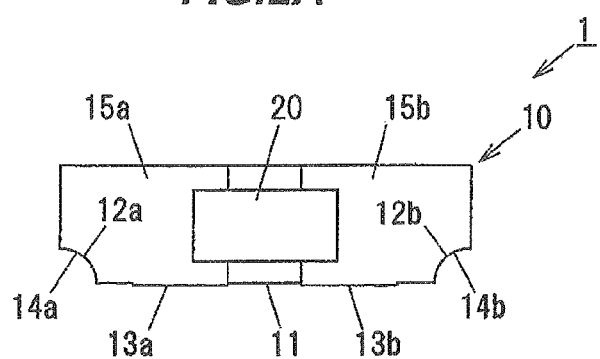
FIGS. 2A and 2B are plan views showing the light-emitting device in the embodiment.
Figure 2B:
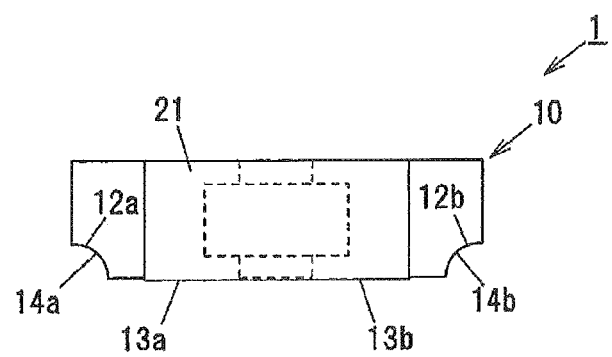

FIGS. 1A and 1B are perspective views showing a light-emitting device 1 in an embodiment and FIGS. 2A and 2B are plan views showing the light-emitting device 1 in the embodiment.

The light-emitting device 1 is a side view type surface mounted light-emitting device and has a submount substrate 10, a light-emitting element 20 mounted on the submount substrate 10, and a phosphor layer 21 covering the light-emitting element 20. FIGS. 1A and 2A show the state before forming the phosphor layer 21, and FIGS. 1B and 2B show the state after forming the phosphor layer 21.

The submount substrate 10 has a mounting surface 11 on one side surface and end through-holes 12a and 12b formed at both edges of the mounting surface 11. The mounting surface 11 is a surface to be connected to a wiring board when the light-emitting device 1 is mounted on the wiring board. Although the end through-holes 12a and 12b have a fan shape in the example shown in FIGS. 1A, 1B, 2A and 2B, the shape of the end through-holes 12a and 12b is not limited thereto.

A first flat terminal 13a and a second flat terminal 13b are formed on the mounting surface 11. A first through-hole terminal 14a and a second through-hole terminal 14b are respectively formed on inner surfaces of the end through-holes 12a and 12b at both edges of the mounting surface 11.

At least one of the first flat terminal 13a and the first through-hole terminal 14a and at least one of the second flat terminal 13b and the second through-hole terminal 14b are terminals to be connected to power supply electrodes of a wiring board on which the light-emitting device 1 is mounted. Then, at least one of the first flat terminal 13a and the first through-hole terminal 14a is electrically connected to one of n-side and p-side electrodes of the light-emitting element 20, and at least one of the second flat terminal 13b and the second through-hole terminal 14b is electrically connected to the other of the n-side and p-side electrodes of the light-emitting element 20.

In the example shown in FIGS. 1A, 1B, 2A and 2B, the first through-hole terminal 14a, together with the first flat terminal 13a, is connected to one of the electrodes of the light-emitting element 20 via a wiring 15a which is provided on a surface of the submount substrate 10. Likewise, the second through-hole terminal 14b, together with the second flat terminal 13b, is connected to the other electrode of the light-emitting element 20 via a wiring 15b which is provided on the surface of the submount substrate 10.

In case that both the first flat terminal 13a and the first through-hole terminal 14a and both the second flat terminal 13b and the second through-hole terminal 14b are electrically connected to the light-emitting element 20, all of them may be terminals to be connected to power supply electrodes of the wiring board, or alternatively, either the first flat terminal 13a or the first through-hole terminal 14a and either the second flat terminal 13b or the second through-hole terminal 14b may be terminals to be connected to non-connect (NC) electrodes or ground (GND) electrodes.

The submount substrate 10 is, e.g., a glass epoxy substrate or a ceramic substrate formed of alumina or aluminum nitride, etc. The first flat terminal 13a, the second flat terminal 13b, the first through-hole terminal 14a, the second through-hole terminal 14b and the wirings 15a and 15b are formed of, e.g., a metal laminate film such as Cu/Ni/Au, Cu/Ni/Pd/Au, Cu/Ni/Ag or Cu/Ni/Pd/Ag.

The light-emitting element 20 is, e.g., an LED chip or a laser diode chip. The light-emitting element 20 may be either of face-up type or face-down type and is preferably, e.g., a flip-chip mount element to reduce the size of the light-emitting device 1. As an alternative, plural light-emitting elements 20 may be mounted on the submount substrate 10.

The phosphor layer 21 is formed of, e.g., a transparent resin such as silicone-based resin or epoxy-based resin in which phosphor particles are dispersed. Fluorescence color of the phosphor is not specifically limited and, for example, particles of BOS (barium orthosilicate) phosphor or YAG (yttrium aluminum garnet) phosphor are used as yellow phosphor particles. For example, when emission color of the light-emitting element 20 is blue and fluorescence color of the phosphor is yellow, emission color of the light-emitting device 1 is white Method of Manufacturing the Light-Emitting Device FIGS. 3A and 3B are cross-sectional views showing part of a process of manufacturing the light-emitting device 1 in the embodiment.

Figure 3A:
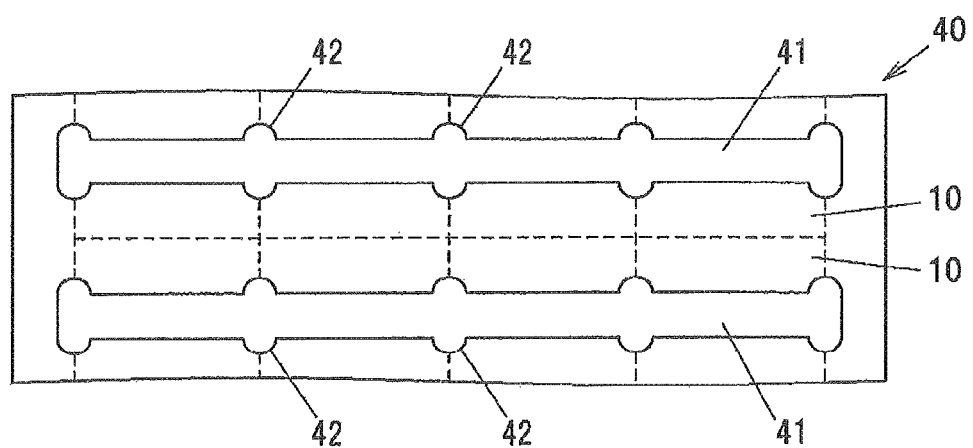
FIGS. 3A and 3B are cross-sectional views showing part of a process of manufacturing the light-emitting device in the embodiment.

Firstly, as shown in FIG. 3A, slit-shaped holes 41 are formed on a substrate 40 by drilling, etc., to cut out the submount substrates 10. Each hole 41 has bulging portions 42 provided to form the first through-hole terminals 14a and the second through-hole terminals 14b on the submount substrates 10. Dotted lines in the drawing are cutting lines to singulate the submount substrates 10 from the substrate 40.

Figure 3B:
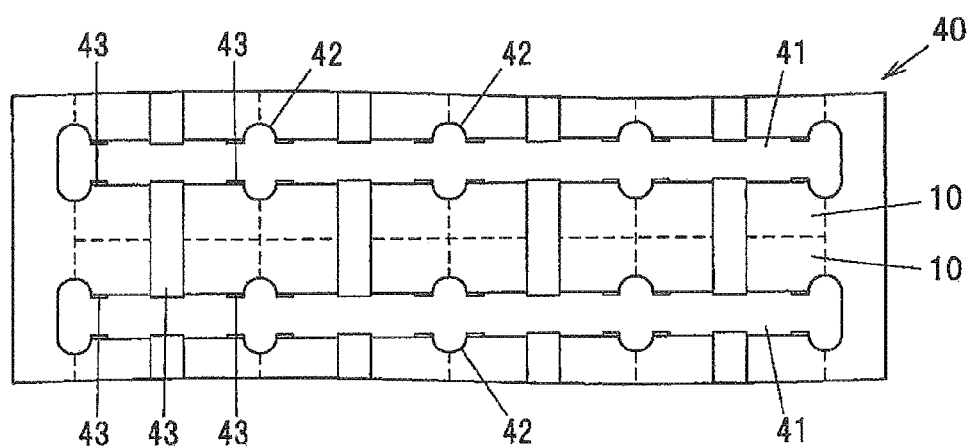

Next, as shown in FIG. 3B, masks 43 for plating are formed on a surface of the substrate 40 at portions from which the submount substrates 10 are cut out.

After that, the substrate 40 is plated and the masks 43 are then removed. The first flat terminal 13a, the second flat terminal 13b, the first through-hole terminal 14a, the second through-hole terminal 14b and the wirings 15a and 15b are thereby formed.

Then, the light-emitting elements 20 and the phosphor layers 21 are placed on the substrate 40 and the substrate 40 is subsequently cut along the cutting lines indicated by the dotted lines, thereby obtaining the light-emitting devices 1 shown in FIGS. 1A, 1B, 2A and 2B.

Method of Mounting the Light-Emitting Device

FIGS. 4A and 4B are side and top views showing a process of mounting the light-emitting device 1 in the embodiment by reflow soldering.

FIG. 4A is a diagram as viewed from a lateral side of a wiring board 30 on which the light-emitting devices 1 is mounted, and FIG. 4B is a diagram as viewed from above the wiring board 30. In FIG. 4B, illustration of the light-emitting device 1 is omitted and the installation position of the submount substrate 10 is indicated by a dotted line.

The wiring board 30 has solder patterns 31a and 31b respectively connected to the first flat terminal 13a and the second flat terminal 13b, and solder patterns 32a and 32b respectively connected to the first through-hole terminal 14a and the second through-hole terminal 14b. For example, the solder patterns 31a and 31b are power supply electrodes, and the solder patterns 32a and 32b are power supply electrodes, non-connect electrodes or ground electrodes.

The solder patterns 31a, 31b, 32a and 32b are patterns formed of solder paste called cream solder printed on a surface of the wiring board 30.

Solders 33a and 33b formed of cream solder applied in a raised shape are respectively formed on the solder patterns 32a and 32b at positions to be connected to the through-hole terminal 14a and the second through-hole terminal 14b.

To solder the light-emitting device, the solder patterns 31a, 31b, 32a and 32b and the solders 33a and 33b are melted by heating the wiring board 30 in a state in which the first flat terminal 13a and the second flat terminal 13b are respectively in contact with the solder patterns 31a and 31b and the first through-hole terminal 14a and the second through-hole terminal 14b are respectively in contact with the solders 33a and 33b, as shown in FIGS. 4A and 4B.

In reflow soldering, a force automatically correcting the position of the light-emitting device basically acts due to surface tension of the solder (self-alignment effect). However, when mounting downsized light-emitting devices in recent years, the self-alignment effect is not sufficiently exerted and displacement (tilt from the right position when viewed in a direction perpendicular to the surface of the wiring board 30) is likely to occur.

In contrast, in the present embodiment, the light-emitting device 1 is soldered to the wiring board 30 at four points. This enhances the self-alignment effect as compared to the conventional mounting method in which the light-emitting device is generally soldered at two points, and it is thereby possible to prevent displacement of the light-emitting device more effectively.

In addition, fillets are formed by the solders 33a and 33b connected to the first through-hole terminal 14a and the second through-hole terminal 14b, and allow mounting strength to be improved as compared to when soldering using only a solder pattern.

Furthermore, when a surface of the submount substrate 10 opposite to the surface mounting the light-emitting element 20 is continuously plated from the first through-hole terminal to the second through-hole terminal, excess portions of the solders 33a and 33b can escape to the plated portion at the time of the soldering. Therefore, it is possible to prevent tilt, when viewed in a direction parallel to the surface of the wiring board 30, of the light-emitting device 1 caused by the excess amount of the solders 33a and 33b or by imbalance between the amount of the solder 33a and the amount of the solder 33b.

Effects of the Embodiment

In the embodiment, it is possible to prevent displacement of the light-emitting device at the time of mounting the light-emitting device on a wiring board by reflow soldering.

Although the embodiment of the invention has been described, the invention is not intended to be limited to the embodiment and the various kinds of modifications can be implemented without departing from the gist of the invention.

In addition, the invention according to claims is not to be limited to the embodiment. Further, please note that all combinations of the features described in the embodiment are not necessary to solve the problem of the invention.

What is claimed is:

1. A side view type surface mounted light-emitting device, comprising;
   a submount substrate that comprises a mounting surface on one side surface and end through-holes formed at both edges of the mounting surface;
   a light-emitting element mounted on a surface of the submount substrate orthogonal to the mounting surface;
   first and second flat terminals formed opposite the mounting surface; and
   first and second through-hole terminals respectively formed on inner surfaces of the end through-holes at both edges of the mounting surface,
   wherein at least one of the first flat terminal and the first through-hole terminal is electrically connected to one of n-side and p-side electrodes of the light-emitting element, and at least one of the second flat terminal and the second through-hole terminal is electrically connected to an other of the n-side and p-side electrodes of the light-emitting element, and
   wherein, in a side view from a side of the mounting surface, the light-emitting element extends above the first and second flat terminals.

2. The light-emitting device according to claim 1, wherein both the first flat terminal and the first through-hole terminal are electrically connected to one of the n-side and p-side electrodes of the light-emitting element, and
   wherein both the second flat terminal and the second through-hole terminal are electrically connected to the other of the n-side and p-side electrodes of the light-emitting element.

3. The light-emitting device according to claim 2, wherein either the first flat terminal or the first through-hole terminal and either the second flat terminal or the second through-hole terminal include terminals to be connected to non-connect electrodes or ground electrodes.

4. The light-emitting device according to claim 1, wherein another surface of the submount substrate, opposite to the surface on which the light-emitting element is mounted, is continuously plated from the first through-hole terminal and from the second through-hole terminal.

5. The light-emitting device according to claim 1, wherein the mounting surface is configured to be connected to a wiring board when the light-emitting device is mounted on the wiring board.

6. The light-emitting device according to claim 5, wherein said at least one of the first flat terminal and the first through-hole terminal includes terminals to be connected to a power supply of the wiring board.

7. The light-emitting device according to claim 1, wherein the light-emitting element includes a flip-chip mount element.

8. The light-emitting device according to claim 1, further comprising a phosphor layer disposed on the light-emitting element.

9. The light-emitting device according to claim 1, wherein, on the one side surface, at least one of the first and second through-hole terminals extends to a bottom surface of the submount substrate.

10. The light-emitting device according to claim 9, wherein, on the one side surface, the end through-holes extend to the bottom surface of the submount substrate.

11. The light-emitting device according to claim 10, wherein, on the one side surface, the mounting surface extends to the bottom surface of the submount substrate.

12. The light-emitting device according to claim 1, wherein, on the one side surface, the first and second through-hole terminals extend to a bottom surface of the submount substrate.

13. The light-emitting device according to claim 1, wherein the mounting surface extends from a top surface of the submount substrate in a direction perpendicular to a protrusion direction of the light-emitting element from the top surface the submount substrate.

14. The light-emitting device according to claim 13, wherein the mounting surface is configured to be connected to a wiring board when the light-emitting device is mounted on the wiring board.

15. The light-emitting device according to claim 1, wherein one of the end through-holes, the first flat terminal, the mounting surface, the second flat terminal, and another one of the end through-holes are sequentially arranged on the one side surface of the submount substrate.

16. The light-emitting device according to claim 1, wherein one of the end through-holes, the first flat terminal, the mounting surface, the second flat terminal, and another one of the end through-holes are exposed on the one side surface of the submount substrate.

17. The light-emitting device according to claim 1, wherein the mounting surface is exposed between the first and second flat terminals.

18. The light-emitting device according to claim 1, wherein, in the side view, the light-emitting element is placed adjacent to the first and second flat terminals.

19. The light-emitting device according to claim 1, wherein, in the side view, the light-emitting element is placed adjacent to and above the mounting surface.

20. The light-emitting device according to claim 1, wherein the at least one of the first flat terminal and the first through-hole terminal is placed above and directly connected to the one of n-side and p-side electrodes of the light-emitting element, and the at least one of the second flat terminal and the second through-hole terminal is placed above and directly connected to the other of the n-side and p-side electrodes of the light-emitting element.

* * * * *